United States Patent

Van Dyke-Lewis et al.

[11] Patent Number: 5,966,085
[45] Date of Patent: Oct. 12, 1999

[54] METHODS AND APPARATUS FOR PERFORMING FAST FLOATING POINT OPERATIONS

[75] Inventors: Michele D. Van Dyke-Lewis; Woodrow Meeker, both of Orlando, Fla.

[73] Assignee: Lockheed Martin Corporation, Bethesda, Md.

[21] Appl. No.: 09/057,040

[22] Filed: Apr. 9, 1998

[51] Int. Cl.[6] ............................. H03M 7/00; G06F 7/38
[52] U.S. Cl. ............................................. 341/95; 708/496
[58] Field of Search ................................. 341/95, 50, 60; 708/496, 204, 513

[56] References Cited

U.S. PATENT DOCUMENTS

| 5,016,210 | 5/1991 | Sprague et al. | 708/495 |
| 5,483,476 | 1/1996 | Horen et al. | 708/498 |

OTHER PUBLICATIONS

Texas Instruments TMS320C4x "User's Guide," 2564090–9721 revision A, May, 1991.
IEEE Standard for Binary Floating–Point Arithmetic, ANSI/IEEE Std. 754–1985, New York, NY, Aug. 12, 1985.

*Primary Examiner*—Marc S. Hoff
*Assistant Examiner*—Peguy Jean Pierre
*Attorney, Agent, or Firm*—Burns, Doane, Swecker & Mathis, LLP

[57] ABSTRACT

A format for representing floating point numbers reduces the overhead typically associated with parsing floating point numbers and thereby provides for significantly improved processing speeds, particularly for bit-serial processors. According to an exemplary single-precision embodiment, numbers are represented using a 36-bit data format. Extra bits in the representation according to the invention allow certain conditions, such as overflow/underflow and the zero-ness of a number, to be detected and asserted quickly. Other conditions, such as denormalization are subsumed into normal processing through the extension of an exponent range in the representation.

10 Claims, 2 Drawing Sheets

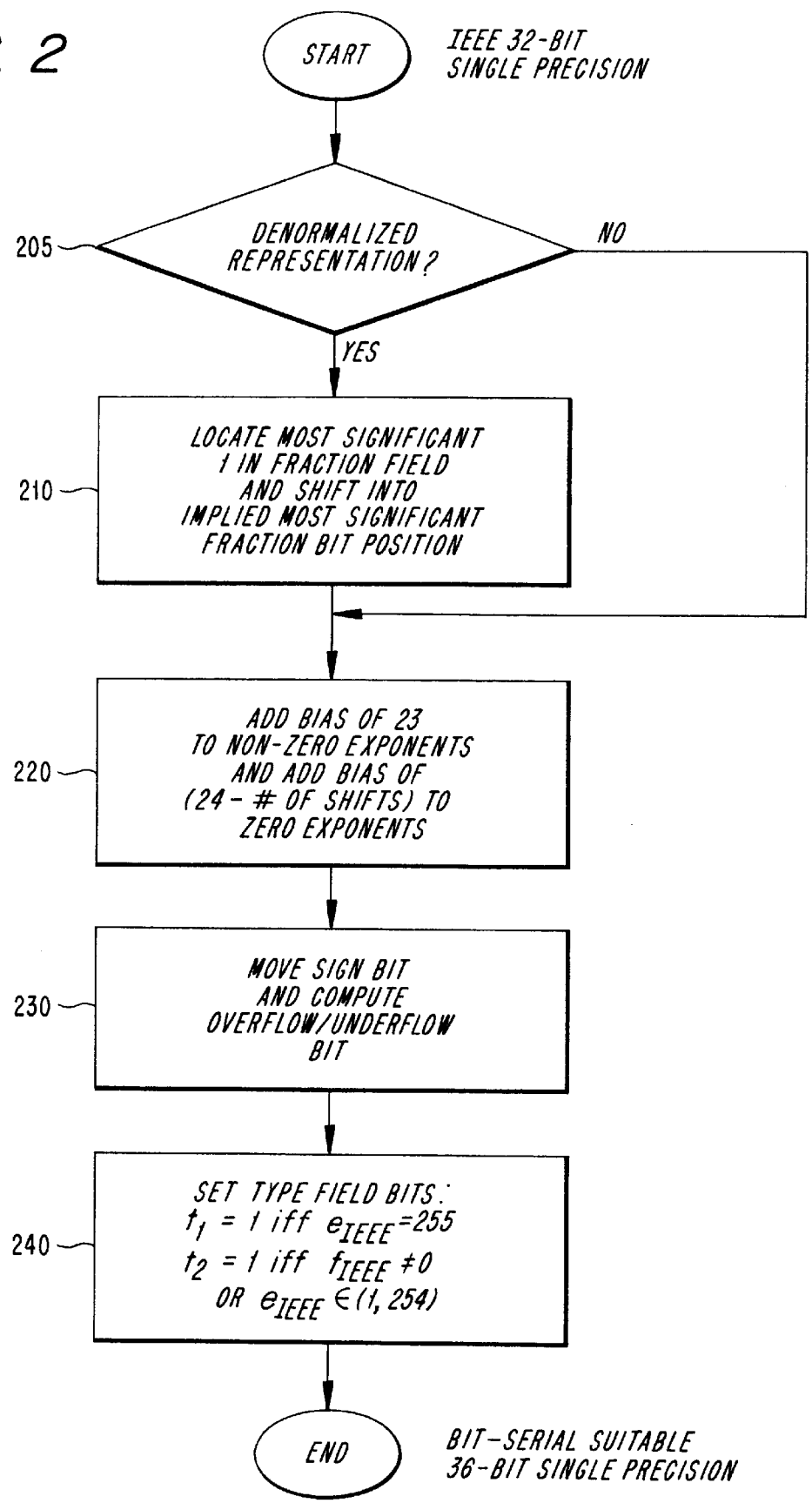

METHODS AND APPARATUS FOR PERFORMING FAST FLOATING POINT OPERATIONS

Some aspects of the present invention were made with Government support under Contract No. F08630-95-2-0001 awarded by Air Force Wright Laboratory Armament Directorate. The Government may have certain rights in this invention.

FIELD OF THE INVENTION

The present invention relates to processors, and more particularly, to methods and apparatus for performing floating point operations in processors.

BACKGROUND OF THE INVENTION

Today, bit-serial processors are in widespread use. For example, bit-serial processors are commonly used to efficiently carry out pixel, or bit-plane, operations in image processing applications. See, for example, U.S. patent application Ser. No. 09/057,482, entitled "Mesh Connected Computer" (filed on even date herewith in the name of Abercrombie and under Attorney Docket No. 017750-351), which describes a system for performing image processing operations using arrays of coupled bit-serial processors. As the teachings of the present invention are useful in a system such as that described in the aforementioned patent application, the aforementioned patent application is incorporated herein in its entirety by reference. Those skilled in the art will appreciate, however, that the teachings of the present invention are broadly applicable in processors generally, irrespective of the particular form of processor in which the invention is employed (and irrespective of whether the processor is a bit-serial processor or a multiple-bit or parallel processor).

Generally, and for purposes of the discussion that follows, a bit-serial processor is any processor including an arithmetic logic unit configured to operate on single-bit, or few-bit, data and/or control inputs. The arithmetic logic used to construct such a bit-serial processor is typically minimal, and such logic is most often used to access and process only single-bit operands within a given clock cycle. Thus, an individual bit-serial processor typically provides an elemental computing platform. However, when many bit-serial processors are coupled in a strategic fashion, they are quite powerful, and extremely fast, particularly in applications in which a common operation must be performed simultaneously on many single-bit, or few-bit, operands. Such is often the case, for example, in image processing applications, wherein entire pixel-data bit-planes are manipulated in unison. See, for example, the above incorporated patent application.

By definition, then, conventional bit-serial processors require many clock cycles to perform multi-pass operations such as multiplying or dividing two multiple-bit numbers. Whereas a multiple-bit processor can employ considerable arithmetic and control logic to enable multiple-bit computations to occur within a single or very few clock cycles, conventional bit-serial processors expend many clock cycles performing multiple-bit computations in a multiple-pass fashion. This problem is exacerbated by the fact that bit-serial processors are often required to operate on numbers which are digitally represented using the IEEE standard floating point format or an equivalent.

The IEEE floating point standard (ANSI/IEEE Std 754-1985 Standard for Binary Floating Point Arithmetic) is predicated upon a need to represent as much information as possible in 32 bits (for single precision numbers). Thus, important information (e.g., the zero-ness of a number) is encoded and can be extracted only by examining multiple bits. Further, the standard specifies special treatment for "denormalized" numbers (i.e., operands falling outside the range of the IEEE 8-bit exponent, but still close enough that incomplete information on the operand value can be conveyed). Thus, the IEEE format is not well suited to bit-serial processors, requiring many clock cycles to execute even the most basic operations.

Nonetheless, an ability to quickly perform multiple-bit computations on floating point numbers is often critical to the overall performance of a bit-serial signal processing implementation. Consequently, there is a need for improved methods and apparatus for performing floating point operations in processors.

SUMMARY OF THE INVENTION

The present invention fulfills the above-described and other needs by providing a format for representing floating point numbers which lends itself readily to bit-serial processing but which nonetheless preserves all information required by the IEEE standard. Advantageously, bit-serial processors can achieve significantly improved performance and speed by internally utilizing the format according to the invention.

In an exemplary single-precision embodiment, numbers are represented using a 36-bit data format. Extra bits in the representation according to the invention allow certain conditions, such as overflow and the zero-ness of a number, to be detected or asserted quickly by a bit-serial processor. Other conditions, such as denormalization are subsumed into normal processing through the extension of an exponent range in the representation. Thus, the floating point representation according to the invention allows for the detection and assertion of various important conditions (e.g., zero-ness and overflow), without requiring time-consuming multi-bit operations on the part of a bit-serial processor. Advantageously, bit-serial processors constructed to implement the techniques of the invention can achieve improvements in processing speed which range from marginal to 100% of conventional processing speeds, depending on the particular floating point operation being executed.

The above-described and other features and advantages of the present invention are explained in detail hereinafter with reference to the illustrative examples shown in the accompanying drawings. Those skilled in the art will appreciate that the described embodiments are provided for purposes of illustration and understanding and that numerous equivalent embodiments are contemplated herein.

BRIEF DESCRIPTION OF THE DRAWINGS

FIG. 2 depicts steps in an exemplary conversion method according to the invention, the method providing for efficient conversion between IEEE-standard floating point format and a floating point format according to the invention.

DETAILED DESCRIPTION OF THE INVENTION

Figure 1A:
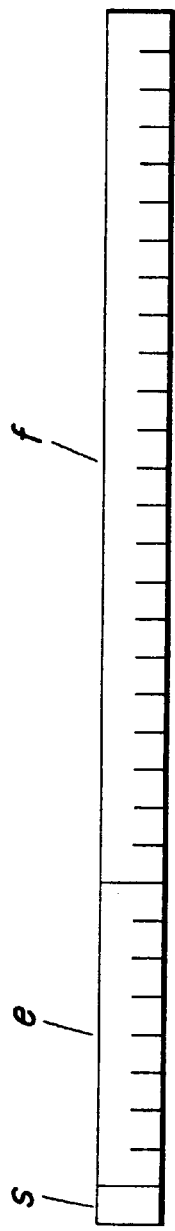
FIG. 1A depicts bit fields in an IEEE-standard single-precision floating point representation.

To illustrate the features and advantages of the floating point representation according to the invention, a brief description of the IEEE-standard floating point representation is provided. According to the IEEE-standard, a 32-bit single precision floating point number is composed of three fields, including a fraction field f, an exponent field e and a sign field s. Assuming that bit 0 is the least significant bit of the 32-bit representation, then the fraction, exponent and sign fields f, e, s include bits 0 through 22, bits 23 through 30, and bit 31, respectively, as shown in FIG. 1A. The value v of an IEEE-standard single-precision floating point number is then calculated from the three fields f, e, s using the following formula (where NaN indicates the condition "not a number" and INF indicates the condition "infinity"):

$$v = \begin{cases} NaN & e = 255, f \neq 0; \\ (-1)^s INF & e = 255, f = 0; \\ (-1)^s 2^{(e-127)}(1.f) & 0 < e < 255; \\ (-1)^s 2^{-126}(0.f) & e = 0, f \neq 0; \\ (-1)^s 0 & e = 0, f = 0. \end{cases}$$

Thus, the IEEE-standard representation requires operands to be handled in a number of different ways, depending upon the condition of the operand (e.g., zero-ness) for each floating point operation. This varied handling, along with the handling of denormalized numbers (i.e., non-zero floating point numbers having an exponent equal to zero), adds overhead in any processing environment and amounts to a significant fraction of the processing required in typical bit-serial implementations. For example, IEEE floating point parsing constitutes roughly half of the processing required to carry out a floating point multiplication in a conventional bit-serial processor. The problem is exacerbated when arrays of bit-serial processors are used to simultaneously process separate data streams in lock-step fashion, since all of the processors in an array are slowed down when any single processor in the array must take time to parse, for example, a denormalized number.

Figure 1B:
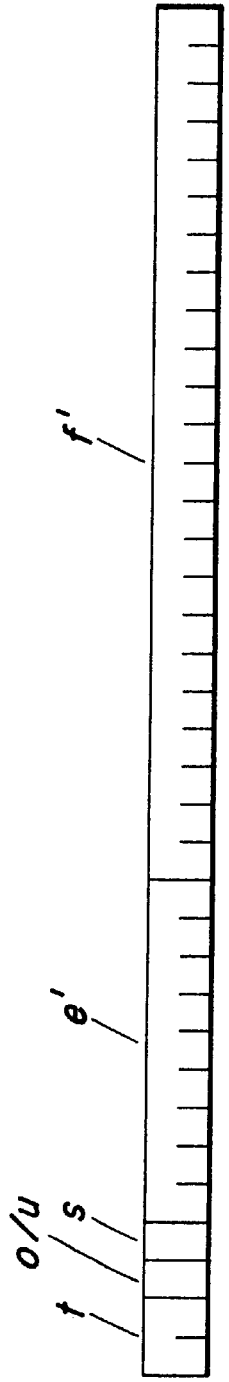
FIG. 1B depicts bit fields in an exemplary single-precision floating point representation according to the invention.

To eliminate this overhead, and to thereby allow processors to operate more efficiently and quickly, the present invention provides an alternative floating point representation which is particularly well suited for use in bit-serial processors. According to an exemplary single-precision floating point representation of the invention, the three-field 32-bit IEEE-standard format is converted into a 36-bit format comprising five fields. Specifically, the exemplary floating point representation includes: a two-bit field t which encodes the special cases of not-a-number, infinity and zero; a one-bit overflow/underflow field o/u; a one-bit sign field s; a nine-bit exponent field e'; and a 23-bit fraction field f' (having an implied most significant bit of 1). According to an exemplary embodiment, the five fields f', e', s, o/u, t are located in bits 0–22, 23–31, 32, 33 and 34–35, respectively, as shown in FIG. 1B.

Advantageously, the expanded nine-bit exponent allows for non-zero values between $2^{-150}$ and $2^{127}$, inclusive, and thus allows all of the numbers which are representable in the IEEE format to be represented without the use of denormalized values (i.e., zero exponent). To maintain compatibility with the IEEE format, numbers generated using the format of the invention can be restricted to the set of numbers which are representable using the IEEE format (e.g., a result lying outside the IEEE set of permissible numbers can be modified to look like an overflow or underflow).

The value w of a floating point number represented according to the embodiment is computed from the five fields t, o/u, s, e', f' using the following formula:

$$w = \begin{cases} NaN & t = 3; \\ (-1)^s INF & t = 2; \\ (-1)^s 2^{(e'-150)}(1.f') & t = 1, 0 < = e' < = 277; \\ (-1)^s 0 & t = 0. \end{cases}$$

Encoding of the special cases field t and the overflow/underflow field o/u (e.g., bits 35-33) is summarized below in Table I.

TABLE I

| Special Case | 35 | 34 | 33 |
|---|---|---|---|
| zero | 0 | 0 | 0 |
| zero due to underflow | 0 | 0 | 1 |
| non-zero finite | 0 | 1 | 0 |
| non-zero finite | 0 | 1 | 1 |
| infinite | 1 | 0 | 0 |
| infinite due to overflow | 1 | 0 | 1 |
| NaN (input) | 1 | 1 | 0 |
| NaN (signaling) | 1 | 1 | 1 |

Advantageously, the 36-bit floating point format according to the invention allows for immediate detection and assertion of specific conditions (e.g., zero-ness and overflow or underflow), without requiring lengthy multiple-bit operations. Further, no special handling of denormalized numbers is required. Thus, a bit-serial processor constructed to operate using the floating point format according to the invention can achieve significant speed improvements as compared to conventional bit-serial processors which utilize IEEE-standard or equivalent formats. For an example of a bit-serial processor constructed to utilize the floating point format of the invention, see the above incorporated patent application ("Mesh Connected Computer"). Those skilled in the art will appreciate, however, that the floating point formats of the invention are equally applicable in any processor, bit-serial or otherwise.

While a typical bit-serial processor can be readily adapted to take advantage of the floating point format of the invention, it is likely that such a bit-serial processor will still be required, in practice, to interface with other processors (e.g., a control processor configured to supply instructions and data to the bit-serial processor) which utilize the conventional IEEE-standard floating point format. Thus, to accommodate the differences between formats, the present invention also provides an efficient technique for converting between the IEEE-standard format and the more bit-serial suitable format of the invention.

An exemplary conversion routine according to the invention converts a 32-bit IEEE-format floating point number into the five fields t, o/u, s, e', f' of the exemplary 36-bit format described above. Steps in the exemplary method are depicted in FIG. 2. First, at step 205, a determination is made as to whether the IEEE-format number is denormalized. If so, then the fraction field f' of the 36-bit format is calculated at step 210 so that the resulting representation will be normalized. Specifically, the bit location of the most significant one in the IEEE fraction field is located, and the IEEE fraction field is shifted such that the located most significant fraction bit falls into the implied most significant bit position (e.g., bit 23) in the fraction field of the 36-bit format of the invention. For example, given the following denormalized number:

IEEE mantissa = $0.f$ =   0.000  0101  0000  1111  0000  1111
                              |                              |
IEEE bit position:           22                              0 step 210 of the exemplary method generates:

Modified mantissa = $1.f'$ =   1.010  0001  1110  0001  1110  0000
                                   |                          |
Modified bit position:            22                          0

Thereafter, at step 220, the expanded 9-bit exponent is calculated. Specifically, if the IEEE exponent is non-zero, a bias of 23 is added to the IEEE exponent. Additionally, for denormalized IEEE values, the expanded exponent is set equal to the difference of 24 and the amount of shift used, at step 210, to move the most significant one of the IEEE fraction field into the implied most significant bit position of the format according to the invention.

At step 230, the IEEE sign bit is moved into the appropriate bit position (e.g., bit 32), and the overflow/underflow bit is calculated. Initially, the overflow/underflow bit is zero, unless the input value is a signaling NaN (0x7fffffff), in which case the overflow/underflow bit is initialized to one. At step 240, the type field t (e.g., bits 35-34) is determined. Specifically, as shown in Table I, the first type bit (e.g., bit 35) is set if and only if the IEEE exponent is 255, and the second type bit (e.g., bit 34) is set if and only if the IEEE fraction is non-zero or the IEEE exponent is in the range of 1 to 254 inclusive.

Thus, the invention provides an efficient technique for converting between IEEE-format representation and the more bit-serial suitable format of the invention. Those skilled in the art will appreciate that the steps of the method of FIG. 2 can be reversed to provide efficient conversion from the format of the invention to the IEEE-standard format. Those skilled in art will also appreciate that the steps of the method can be implemented in hardware in a straightforward manner (e.g., in an application specific integrated circuit, in a general purpose computer, etc.). For an example of an implementation of the exemplary method in a bit-serial application, see the above incorporated patent application (entitled "Mesh Connected Computer").

Those skilled in the art will appreciate that the present invention is not limited to the specific exemplary embodiments which have been described herein for purposes of illustration and that numerous alternative embodiments are also contemplated. For example, an analogous double-precision format can be readily devised. Further, the precise bit locations within the exemplary format of the invention, as well as the precise lengths of the five fields in the exemplary format are provided by way of illustration, and any format in which special conditions are encoded in a separate, readily accessible field and/or in which denormalized numbers are subsumed within modified exponent and fraction fields is contemplated herein. The scope of the invention is therefore defined by the claims which are appended hereto, rather than the foregoing description, and all equivalents which are consistent with the meaning of the claims are intended to be embraced therein.

We claim:

1. A method for encoding a value using a fixed number of bits, comprising the steps of:

partitioning the fixed number of bits into a one-bit sign field, a one-bit overflow/underflow field, a multiple-bit type field, a multiple-bit fraction field and a multiple bit exponent field;

setting the one-bit sign field to indicate a sign of the value;

setting the one-bit overflow/underflow field to indicate whether the value is a result of one of an overflow and an underflow condition;

setting the multiple-bit type field to indicate whether the value is any of at least three special value types, said at least three special value types including zero, infinity and not a number;

setting the multiple-bit fraction field equal to a fractional part of a normalized representation of the value; and setting the multiple-bit exponent field equal to an exponent of a normalized representation of the value.

2. A method for converting a first floating point representation of a number to a second floating point representation of the number, wherein said first floating point representation includes a fraction field and an exponent field and results from a first floating point representation scheme, the first floating point representation scheme permitting the use of both normalized and denormalized fraction and exponent values to represent a finite set of possible numbers, said method comprising the steps of:

decoding the fraction field and the exponent field of the first floating point representation of the number to obtain a value of the number;

encoding the value of the number in an expanded exponent field and a corresponding fraction field of the second floating point representation, guaranteeing that the expanded exponent field and the corresponding fraction field are normalized;

determining whether the value of the first number is any of at least three special value types, the at least three special value types including zero, infinity and not a number; and encoding a type field of the second floating point representation to indicate whether the value of the first number is any of the at least three special types.

3. Apparatus configured to encode a value using a fixed number of bits, comprising:

means for partitioning the fixed number of bits into a one-bit sign field, a one-bit overflow/underflow field, a multiple-bit type field, a multiple-bit fraction field and a multiple bit exponent field;

means for setting the one-bit sign field to indicate a sign of the value;

means for setting the one-bit overflow/underflow field to indicate whether the value is a result of one of an overflow and an underflow condition;

means for setting the multiple-bit type field to indicate whether the value is any of at least three special value types, said at least three special value types including zero, infinity and not a number;

means for setting the multiple-bit fraction field equal to a fractional part of a normalized representation of the value; and means for setting the multiple-bit exponent field equal to an exponent of a normalized representation of the value.

4. The apparatus of claim 3, further comprising a bit-serial processor.

5. The apparatus of claim 3, further comprising an array of processors.

6. The apparatus of claim 5, wherein said processors are bit-serial processors.

7. Apparatus configured to convert a first floating point representation of a number to a second floating point representation of the number, wherein said first floating point representation includes a fraction field and an exponent field and results from a first floating point representation scheme, the first floating point representation scheme permitting the use of both normalized and denormalized fraction and exponent values to represent a finite set of possible numbers, said apparatus comprising:

means for decoding the fraction field and the exponent field of the first floating point representation of the number to obtain a value of the number;

means for encoding the value of the number in an expanded exponent field and a corresponding fraction field of the second floating point representation, guaranteeing that the expanded exponent field and the corresponding fraction field are normalized;

means for determining whether the value of the first number is any of at least three special value types, the at least three special value types including zero, infinity and not a number; and means for encoding a type field of the second floating point representation to indicate whether the value of the first number is any of the at least three special types.

8. The apparatus of claim 7, further comprising a bit-serial processor.

9. The apparatus of claim 7, further comprising an array of processors.

10. The apparatus of claim 9, wherein said processors are bit-serial processors.

\* \* \* \* \*